United States Patent [19]

Beasom

[11] Patent Number: 5,448,100
[45] Date of Patent: Sep. 5, 1995

[54] BREAKDOWN DIODE STRUCTURE

[75] Inventor: James D. Beasom, Melbourne, Fla.

[73] Assignee: Harris Corporation, Melbourne, Fla.

[21] Appl. No.: 919,001

[22] Filed: Jul. 23, 1992

Related U.S. Application Data

[63] Continuation of Ser. No. 826,813, Jan. 28, 1992, abandoned, which is a continuation of Ser. No. 407,729, Sep. 14, 1989, abandoned, which is a continuation of Ser. No. 702,609, Feb. 19, 1985, abandoned.

[51] Int. Cl.⁶ .............................................. H01L 27/04
[52] U.S. Cl. .................................. 257/487; 257/488; 257/492; 257/493; 257/524
[58] Field of Search ............................. 257/487–488, 257/492–493, 524–527

[56] References Cited

U.S. PATENT DOCUMENTS

| | | | |
|---|---|---|---|
| 3,446,995 | 5/1969 | Castrucci | 357/53 |
| 3,489,953 | 1/1970 | Thomas | 29/577 |
| 3,683,491 | 8/1972 | Nelson et al. | 29/571 |
| 3,836,998 | 9/1974 | Kocsis et al. | 357/53 |
| 3,845,495 | 10/1974 | Cauge et al. | 357/49 |
| 4,232,328 | 11/1980 | Hartman et al. | 357/49 |
| 4,242,697 | 12/1988 | Berthold et al. | 357/49 |
| 4,260,431 | 4/1981 | Piotrowski | 357/49 |
| 4,371,886 | 2/1983 | Hartman et al. | 357/49 |
| 4,371,887 | 2/1983 | Hartman et al. | 357/49 |
| 4,587,656 | 5/1986 | Hartman et al. | 357/41 |
| 4,608,590 | 8/1986 | Hartman et al. | 357/49 |

FOREIGN PATENT DOCUMENTS 56-118371   2/1980   Japan ................................ 357/53

OTHER PUBLICATIONS

S. M. Sze, *Semiconductor Device Physics and Technology*, John Wiley & Sons, New York (1985) p. 160.
"Surface Breakdown in Silicon Planar Diodes Equipped with Field Plates" *Solid–State Electronics*, 1972, vol. 15, pp. 93–105, Conti & Conti.

Primary Examiner—J. Carroll
Attorney, Agent, or Firm—Rogers & Killeen

[57] ABSTRACT

A high voltage diode having a field plate and substrate separated from a high impurity concentration region by dielectric layers and biased to deplete the high impurity concentration region therebetween before critical field for avalanche is reached for the region.

17 Claims, 3 Drawing Sheets

BREAKDOWN DIODE STRUCTURE

This is a continuation of application Ser. No. 07/826,813 filed Jan. 28, 1992, abandoned, which is a continuation of application Ser. No. 07/407,729 filed Sep. 14, 1989, abandoned, which is a continuation of Ser. No. 06/702,609 filed Feb. 19 1985, abandoned.

BACKGROUND AND SUMMARY OF THE INVENTION

The present invention relates generally to diode structures for integrated circuits and more specifically to an improved high voltage diode structure for integrated circuits.

The fabrication of high voltage diodes presents several problems. The doping of the more lightly doped side of the diode must be decreased to increase avalanche voltage. The resultilng higher resistivity leads to higher series resistance which is undesirable.

The planar structure is desired for its low leakage, ease of manufacture and reproducible characteristics. Field crowding around the edge of the top layer of a planar diode reduces breakdown voltage for a given background doping.

In diodes, a depletion layer in the lightly doped side exists which is proportional to $(V/N)^{1/n}$ where V is reverse voltage applied to the diode, N is doping concentration of the lightly doped side, and $2 \leq n \leq 3$. At high voltages, V is large and N is small leading to large depletion layers. Such depletion layers require thick islands in integrated circuits which include these diodes to prevent the depletion from extending into the support substrate. Thick islands, as is well known, cause loss of packing density in IC's thus undesirably increasing cost.

One limit to high temperature operation of PN diodes arises from the loss of doping control of the lowest doped region of the diode when the temperature dependent intrinsic carrier concentration equals the impurity doping concentration. Above the temperature at which this equality is reached, diode characteristics degrade dramatically. The high resistivity regions used for conventional high voltage diodes thus lead to restrictive maximum operating temperature for these diodes.

The use of field plates at the surface of a junction to increase the breakdown voltage of the junction is a well known phenomenon. A typical example is U.S. Pat. No. 4,232,328 to Hartman et al. Hartman et al. also biases the polycrystalline support to produce a potential in the support layer to induce a charge of greater/lesser degree in the insulating layer underlying the pocket which attracts/repels the injected minority carries depending upon polarity. In a related patent, U.S. Pat. No. 4,242,697, to Berthold et al., a semi-insulating layer between the single crystalline tub and the polycrystalline substrate has trapping state capability of taking on charge from the single crystalline region. This prevents the potential from the substrate from causing the breakdown of the device and allows the surface regions of the device to remain closer to the polycrystalline substrate.

Thus, it is an object of the present invention to provide an improved diode structure which is capable of high voltage operation.

Another object of the present invention is to provide a high voltage diode structure which is less sensitive to temperature variations.

A still even further object of the present invention is to provide a diode structure having a substantially high background doping and built in a substantially minimal amount of surface space.

Still even a further object of the present invention is to provide a high voltage diode structure which is capable of being built in isolated substrates having a depth greater than that normally effected by the control of a surface field plate.

These and other objects of the invention are attained by using a field plate separated from the surface of the PN junction by an insulative layer and biasing the substrate which is also separated from the PN junction by a dielectric layer sufficient to deplete the entire portion of the background region there between before the critical field for avalanche is reached for that portion. The substrate is a conductive support structure and the diode is built in dielectrically isolated wells. Selecting the impurity concentration of the PN regions take within two orders of magnitude of each other which reduces the series resistance of the diode. The field plate and substrate are biased to voltage less than the more lightly doped region and preferably at the voltage of the more highly doped region.

Other objects, advantages and novel features of the present invention will become apparent from the following detailed description of the invention when considered in conjunction with the accompanying drawings.

DETAILED DESCRIPTION OF THE DRAWINGS

Figure 1:
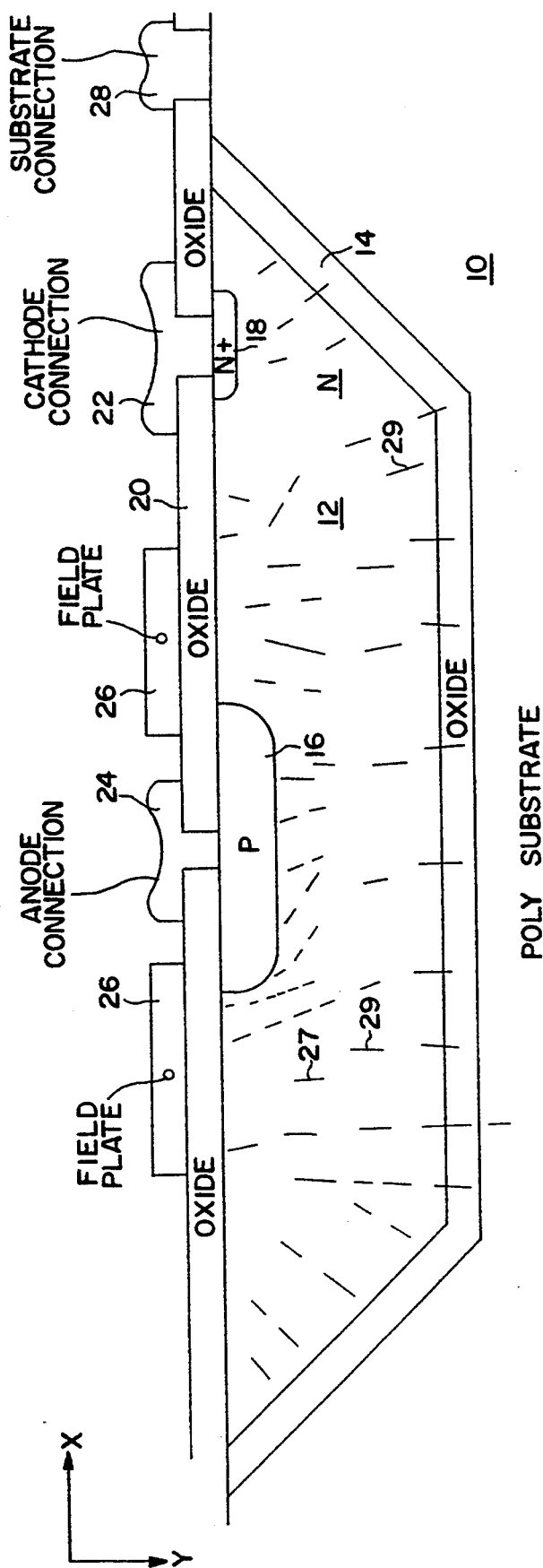
FIG. 1 is a cross-sectional view of an integrated circuit having a diode incorporated in the principles of the present invention.

An integrated circuit as illustrated in FIG. 1 includes a conductive or polycrystalline substrate 10 having N conductivity type wells 12 separated from the substrate 10 by a dielectric or oxide region 14. A P conductivity type region 16 is formed in the surface of the N type region 12 forming a PN junction therewith. An N+ region 18 is also formed in the surface of the N type region 12 and constitutes the cathode connection region. A dielectric or oxide layer 20 is formed on the surface of the substrate 10 and regions 12 and 16. Cathode connection 22 is made to cathode contact region 18 and an anode contact 24 is made to P region 16 through the oxide layer 20. A field plate 26 is formed over the surface junction of regions 12 and 16 and extends laterally in all directions therefrom, The field plate 26 need not cover all the surface junction, but should cover substantially all of the surface junction. A substrate contact 28 is formed through the oxide to the polycrystalline substrate 10.

In an effort to reduce series resistance of the diode, the impurity concentration for the N type region 12 is selected in the range of $1 \times 10^{13}$ to $3 \times 10^{15}$ atoms per cubic centimeter. Since this forms the more lightly doped side of the PN junction, the P type region 16 is selected to have a surface impurity concentration in the range of $5 \times 10^{14}$ to $3 \times 10^{21}$ atoms per cubic centimeter. Preferably, the N type region 12 and the P type region 16 have an impurity concentration within at least two orders of magnitude of each other to reduce series resistance. If this is not a design requirement, the principles of the invention are applicable without this restraint. As will be explained more fully below, the use of the field plate 26 and biasing the substrate 28 allows for an increased impurity concentration in the N type region 12 as well as increasing the depth of the region 12 beyond the depth which would be influenced only by the field plate 26 alone. As a typical example, the depth of the P type region 16 may be in the range 1 to 25 microns and the depth of the N type island 12 in the range 5 to 100 microns.

In order to completely deplete the N type region 12 between field plates 26 and the substrate 10, the field plate 26 and the substrate 10 through contact 28 must be reversed biased with respect to the N type region 12. As used herein, an area is "completely depleted" and "totally depleted" when the entire vertical cross-sectional area of a semiconductor layer (i.e. between the reverse biased field plate and substrate or a reversed biased PN junction and substrate) is depleted. Typically, the field plate 26 and the substrate contact 28 are connected to anode contact 24. As illustrated in FIG. 1, the electrical field 27 produced by the field plate 26 intersects the field lines 29 produced by the substrate 10 to form substantially vertical field lines. The biasing is selected such that the N type region 12 between field plate 26 and subs=rate 10 depletes before the critical field for avalanche is reached in that region. It should also be noted that the region under the anode 16 can also be completely depleted before the critical field for avalanche is reached.

In such a situation, application of additional anode-cathode voltage will not increase the electric field in these regions. Depletion layers can continue to expand only laterally beyond the outer edge of the field plate. As can be seen, the combination of the field lines 27 and 29 form substantially vertical field lines. Thus the depth of the island is greater than that which can be depleted by the field plate alone which increases the design capability for depth as well as impurity concentration for the N type region 12.

Horizontal electric field under the field plate will have a slower rate of change than in a conventional structure because much of the charge in this region is tied up by vertical field lines as described in the previous paragraph $$\frac{dE}{dx} + \frac{dE}{dy} = \frac{N_c}{E}$$

by application of Poisson's equation where E is electric field and $N_c$ is cathode (N island) impurity concentration. Therefore, a longer region of high field can be obtained than in a conventional structure of the same doping. Now voltage is given by $V = -\int E_x \, dx$ from anode diffusion to cathode diffusion. Since the structure has made $E_x$ relatively constant under the field plate, one obtains higher breakdown by increasing the length of the field plate.

A common implementation of the structure would have the field plate tied to the anode and the substrate connected to the anode. An alternate substrate tie, desirable in the case that a high substrate to cathode contact voltage induced breakdown, would be intermediate between the anode and cathode voltages. One way to accomplish this bias is to develop it from the center tap of a resistor divider whose ends are tied to anode and cathode. The resistors might be a part of the chip in their own island or on the surface as thin film resistors.

In an integrated circuit where there might be many diodes and transistors at different voltages, the substrate might be biased at the most negative voltage on the chip or at a voltage intermediate between the most negative and most positive voltages on the chip.

Figure 2:
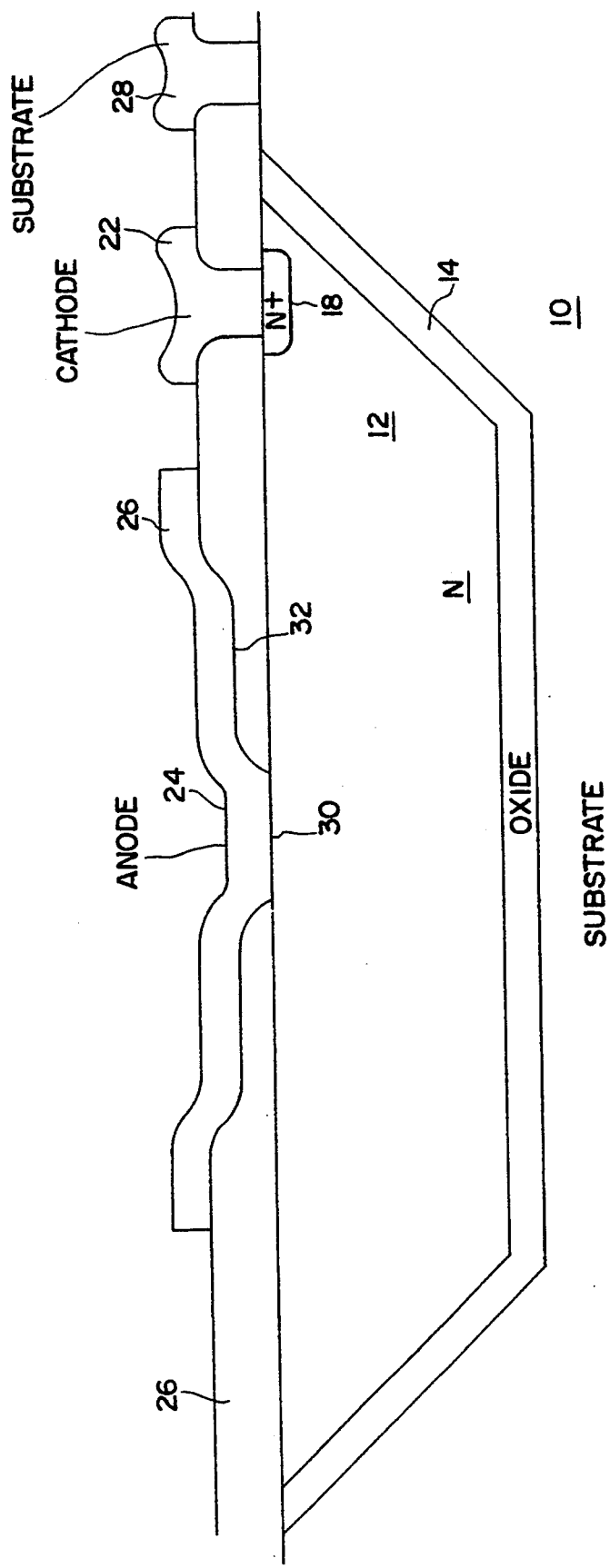
FIG. 2 is a cross-sectional view of an integrated circuit having a Schottky diode incorporated in the principles of the present invention.

In addition to the junction diode of FIG. 1, present invention is also applicable to Schottky barrier diodes as illustrated in FIG. 2. The anode contact 24 is selected of an appropriate metal which forms at surface 30 a Schottky barrier with the N type substrate 12. The field plate 26' is an integral part of the anode contact 24' and extends laterally therefrom. The oxide 20 is stepped at 32 so as to be the thinnest adjacent to the anode Schottky barrier region 30. As in FIG. 1, field contact 26' and substrate contact 28 are reverse biased with respect to the cathode contact 20 so as to completely deplete the N type region 12.

Figure 3:
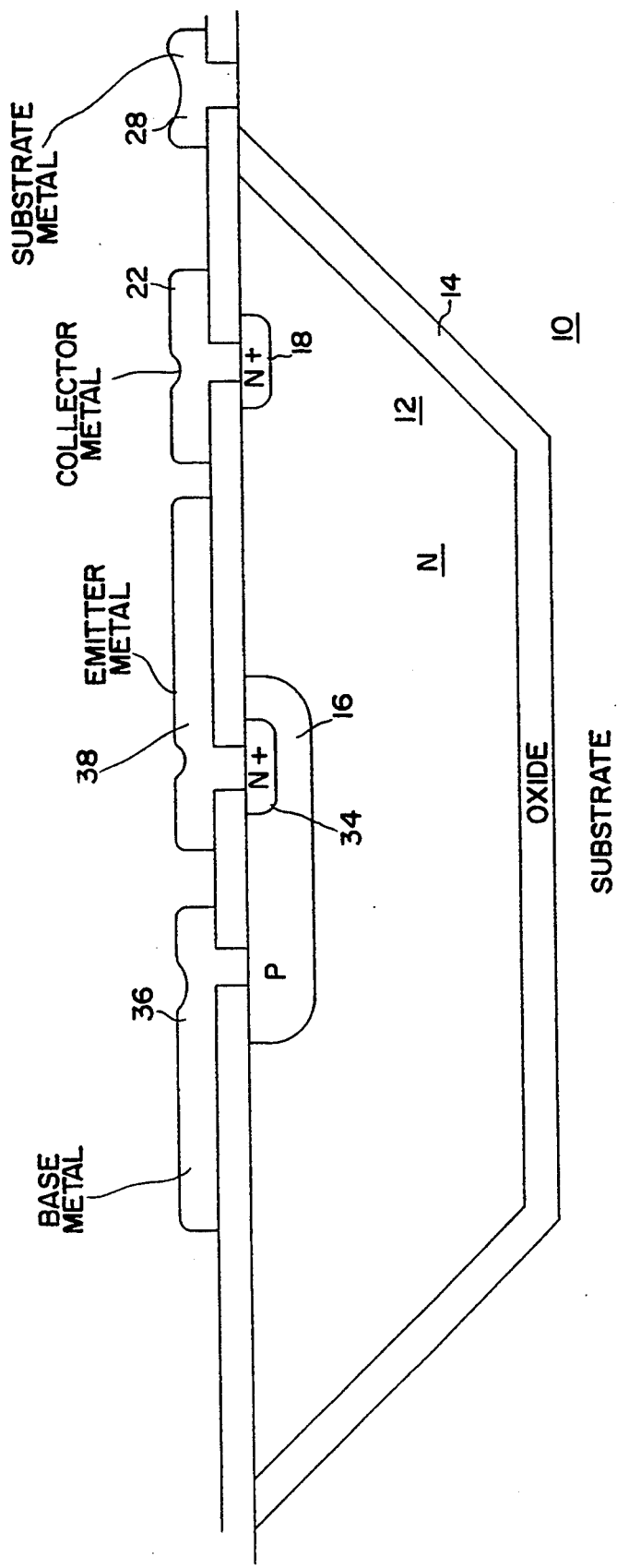
FIG. 3 is a cross-sectional view of a transistor including a diode structure incorporating the principles of the present invention.

Another application of the present invention is to increase the breakdown voltage of a bipolar transistor as illustrated in FIG. 3. An N+ emitter region 34 is formed in the anode region 16 which forms the base of the transistor. A base metal contact 36 is provided to the base region 16 and an emitter contact 38 is made to the emitter region 34. The closely spaced emitter and base metalization 38 and 36, respectively, jointly act as a field plate for the base collector junction and cover substantially portions thereof. The collector to emitter breakdown is increased in the structure over that of a conventional structure of the same doping profile by the fact that the field under the base below the emitter is limited to a value less than the collector-emitter avalanche field by the total depletion of the N region 12 there and further increased by the screening effect afforded by the total depletion from the field plate and the substrate of the adjacent N collector region 12.

It should be noted that the reduction in breakdown voltage present in the prior art structure is avoided in the present invention by designing the spacing between the anode region 16 and substrate 10 a sufficient distance such that biasing the substrate has no effect on avalanche breakdown.

Although the present invention has been described using a P type anode and an N cathode region wherein the N cathode region has a lower impurity concentration, the present invention is also applicable to where the P type anode region is of a lighter concentration. In this case, the field plate and substrate are biased so as to deplete the lighter doped P type region. It should be noted that the lighter concentration region may be a graded region having a higher impurity concentration adjacent the top surface.

From the preceding description of the preferred embodiments, it is evident that the objects of the invention are attained, and although the invention has been described and illustrated in detail, it is to be clearly understood that the same is by way of illustration and example only and is not to be taken by way of limitation. The spirit and scope of the invention are to be limited only by the terms of the appended claims.

What is claimed is:

1. An integrated circuit with an enhanced voltage breakdown comprising:

a layer of semiconductor material of one conductivity type electrically isolated from a substrate and having a region of the opposite conductivity type along an upper surface of said layer forming a PN junction extending to said upper surface exhibiting diode characteristics; and means for totally depleting said layer in a zone extending laterally from the PN junction at said upper surface a distance greater than the distance at which total depletion would occur from the biasing of said region and said substrate, thereby to enhance the breakdown voltage of the integrated circuit.

2. The integrated circuit of claim 1 wherein said means for total depletion includes a field plate.

3. The integrated circuit of claim 2 wherein said means for total depletion includes means for cooperatively biasing said field plate and said substrate such that the areas of depletion within said layer extending downwardly from said field plate and extending upwardly from said substrate merge to effect total depletion of said layer vertically between said field plate and said substrate.

4. A method for enhancing breakdown voltage in a semiconductor region of an integrated circuit structure comprising a first layer of material capable of receiving a voltage bias, a layer of insulative material formed along said first layer, a layer of semiconductor material along said insulative layer and electrically isolated from said first layer by said insulative layer, a region of fourth material formed along an upper surface of said semiconductor layer, said fourth material region and said semiconductor layer forming a junction exhibiting diode characteristics, said junction characterized by a first zone in the semiconductor layer which is depletable when the junction is operated under a reverse bias diode condition, said semiconductor layer including a breakdown resistant region of lateral dimension extending along the upper surface from the first zone and also extending from the upper surface to the insulative layer, the method including the steps of:

depleting the first zone by applying a reverse bias voltage across the junction; and placing the breakdown resistant region in a totally depleted state to form a second depletion zone which extends the totally depleted breakdown resistant region laterally a sufficient distance beyond the first zone to prevent an avalanche condition in the breakdown resistant region prior to occurrence of an avalanche condition in a portion of the integrated circuit structure outside the breakdown resistant region.

5. The method of claim 4 applied to an integrated circuit structure further including a conductive fifth region extending over said breakdown resistant region and wherein depletion of said breakdown resistant region is effected by:

cooperatively applying a first voltage bias to the conductive region and a second voltage bias to the first layer to provide an electric field within said breakdown resistant region.

6. The method of claim 4 including the step of forming said fourth material region within said semiconductor upper surface so that the resulting junction provides a pn diode.

7. The method of claim 4 including the step of forming said fourth material region of metal so that the resulting junction provides a Schottky diode.

8. The method of claim 5 including the step of forming the conductive fifth region in ohmic connection with said fourth material region so that said fourth and fifth regions receive said first voltage bias.

9. The method of claim 8 including the step of simultaneously forming said fourth and fifth regions of the same material.

10. The method of claim 5 including the step of electrically isolating the fifth region from the semiconductor material with an intervening layer of dielectric material.

11. A method for enhancing the breakdown voltage of an integrated circuit structure comprising a layer of semiconductor material of one conductivity type electrically isolated from a biased substrate and having a region of the opposite conductivity type along an upper surface of said layer forming a junction exhibiting diode characteristics, said layer having a first zone contiguous to the junction which is totally depletable when the junction is operated under a reverse bias diode condition, the method including the steps of:
(a) depleting the first zone; and
(b) totally depleting a second zone extending along the upper surface laterally from the first zone and vertically throughout the layer, the second zone extending laterally a distance sufficient to elevate the avalanche voltage in the second zone when totally depleted relative to the avalanche voltage when the second zone is not totally depleted, to thereby enhance the breakdown voltage of the integrated circuit structure.

12. An integrated circuit with an enhanced voltage breakdown comprising:

a layer of semiconductor material of one conductivity type electrically isolated from a substrate and having a region of the opposite conductivity type along an upper surface of said layer forming a junction exhibiting diode characteristics, said layer having a first zone contiguous to the junction which is totally depletable when the junction is operated under a reverse bias diode condition, said layer having a second zone extending along said upper surface laterally from the first zone and vertically throughout said layer;

means for cooperatively biasing said layer and said substrate to totally deplete said first zone and to totally deplete said second zone to a lateral distance from said first zone at which the avalanche voltage in said second zone when totally depleted is elevated relative to the avalanche voltage in said second zone when said second zone is not totally depleted, thereby to enhance the breakdown voltage of the integrated circuit.

13. A method of increasing the breakdown voltage of a high voltage diode having a PN junction extending to a surface of a dielectrically isolated island without increasing the thickness of the island comprising the steps of:

(a) providing a high voltage diode having a PN junction extending to a surface of an island dielectrically isolated from a substrate, the junction separating a more highly doped portion of the island from a more lightly doped portion thereof;

(b) providing a field plate that extends across the surface of the island laterally beyond the PN junction;

(c) applying a first voltage to the more lightly doped portion of the island;

(d) applying a second voltage to the more highly doped portion of the island;

(e) cooperatively biasing the field plate and the substrate to a voltage (i) less than the first voltage, (ii) no more than about the second voltage and (iii) related to the lateral extent of the field plate so as to totally deplete a first region extending laterally from the PN junction and vertically from the field plate to the dielectric therebeneath before a critical field for avalanche is reached in the first region, whereby the breakdown voltage of the diode is increased without increasing the thickness of the island.

14. A method of increasing the breakdown voltage of a high voltage diode having a PN junction extending to a surface of an island dielectrically isolated from a substrate without increasing the thickness of the island comprising the steps of:

(a) providing a PN junction extending to a surface of an island dielectrically isolated from a substrate, the junction separating a more highly doped portion of the island from a more lightly doped portion thereof and the impurity concentration of the more lightly doped portion being greater than about $10^{14}$;

(b) applying a first voltage to the more lightly doped portion of the island;

(d) applying a second voltage to the more highly doped portion of the island; and (e) applying a third voltage to the substrate, the resulting bias being a voltage (i) less than the first voltage, and (ii) no more than about the second voltage so as to totally deplete a first region of the island extending laterally from the PN junction and vertically throughout the island before a critical field for avalanche is reached in the first region, whereby the breakdown voltage of the diode is increased without increasing the thickness of the island.

15. The method of claim 14 wherein the impurity concentration of the more lightly doped portion is within about two orders of magnitude of the impurity concentration of the more highly doped portion.

16. An integrated circuit with an enhanced voltage breakdown comprising:

a layer of semiconductor material of one conductivity type electrically isolated from a substrate and having a region of the opposite conductivity type along an upper surface of said layer forming a junction exhibiting diode characteristics, said layer having an impurity concentration less than and within about two orders of magnitude of an impurity concentration of said region, said layer having a first zone contiguous to the junction which is totally depletable when the junction is operated under a reverse bias diode condition, said layer having a second zone extending along said upper surface laterally from the first zone and vertically throughout said layer;

means for cooperatively biasing said layer and said substrate to totally deplete said first zone and to totally deplete said second zone, thereby to enhance the breakdown voltage of the integrated circuit.

17. The integrated circuit of claim 16 wherein the impurity concentration of said layer is greater than about $10^{14}$.

* * * * *